United States Patent [19]

Ryuo et al.

[11] Patent Number: 5,277,845
[45] Date of Patent: Jan. 11, 1994

[54] OXIDE GARNET SINGLE CRYSTAL

[75] Inventors: Toshihiko Ryuo; Toshiaki Watanabe, both of Gunma, Japan

[73] Assignee: Shin-Etsu Chemical Co., Ltd., Tokyo, Japan

[21] Appl. No.: 973,003

[22] Filed: Nov. 10, 1992

Related U.S. Application Data

[62] Division of Ser. No. 555,723, Jul. 19, 1990, Pat. No. 5,186,866.

[30] Foreign Application Priority Data

Jul. 20, 1989 [JP] Japan ................... 1-188091

[51] Int. Cl.$^5$ ................ G02B 5/20; C01G 49/00
[52] U.S. Cl. .................... 252/584; 423/594; 359/280
[58] Field of Search ......... 252/584, 582, 587, 588; 423/594; 359/280

[56] References Cited

U.S. PATENT DOCUMENTS

| | | | |
|---|---|---|---|
| 3,447,851 | 6/1969 | Remeika et al. | 252/584 |
| 4,077,832 | 3/1978 | Robertson | 423/594 |
| 4,323,618 | 4/1982 | Damen et al. | 423/594 |
| 4,435,484 | 3/1984 | Breed et al. | 252/584 |
| 4,554,449 | 11/1985 | Taniuchi et al. | 359/280 |
| 4,657,782 | 4/1987 | Gomi et al. | 423/594 |
| 4,695,762 | 9/1987 | Berkstresser et al. | 423/594 |
| 4,981,341 | 1/1991 | Brandle, Jr. | 359/280 |

FOREIGN PATENT DOCUMENTS

0039463 11/1981 European Pat. Off. .
0044109 1/1982 European Pat. Off. .
0368483 5/1990 European Pat. Off. .

OTHER PUBLICATIONS

Patent Abstracts of Japan, vol. 12, No. 176, May 25, 1988 and JP A 62 283 821 (Tohoku Metal Ind. Ltd.) Dec. 9, 1987.
Patent Abstracts of Japan, vol. 12, No. 433, Nov. 15, 1988 and JP A 63 159 225 (Tokin Corp.) Jul. 2, 1988.

*Primary Examiner*—Philip Tucker
*Attorney, Agent, or Firm*—McAulay Fisher Nissen Goldberg & Kiel

[57] ABSTRACT

A novel oxide garnet single crystal, which can be epitaxially grown on a rare earth-gallium garnet wafer and exhibiting excellent performance as a material of magneto-optical devices, is disclosed. The oxide garnet single crystal, grown on the substrate surface by the liquid-phase epitaxial method, has a chemical composition expressed by the formula $$(Bi_aEu_bLn_{1-a-b})_3(Fe_{1-c}M_c)_5O_{12},$$

in which Ln is a rare earth element other than europium, e.g., terbium, M is an element selected from the group consisting of aluminum, gallium, indium and scandium, the subscript a is a positive number defined by $0.15 \leq a \leq 0.6$, the subscript b is a positive number defined by $0.01 \leq b \leq 0.2$ and the subscript c is a positive number defined by $0.01 \leq c \leq 0.1$.

5 Claims, 1 Drawing Sheet

OXIDE GARNET SINGLE CRYSTAL

This is a division of application Ser. No. 07/555,723, filed Jul. 19, 1990, now U.S. Pat. No. 5,186,866.

BACKGROUND OF THE INVENTION

The present invention relates to a single crystal of an oxide garnet or, more particularly, to a novel single crystal of an oxide garnet useful as a material of magneto-optical devices such as optical isolators, optical switches and the like exhibiting improved behavior of light absorption at the working wavelengths.

It is an established prior art that magneto-optical devices such as optical isolators and the like are prepared from a single crystal layer of a bismuth-substituted rare earth-iron garnet grown on a substrate single crystal by the liquid-phase epitaxial method. There is an unavoidable problem in this liquid-phase epitaxial method that the garnet single crystal is heavily contaminated with lead or platinum originating in the lead oxide used as a flux of the oxide melt and the platinum-made crucible, respectively. When such a contaminated epitaxial garnet single crystal is used as the magneto-optical element, absorption of light is greatly increased at the working wavelengths of 0.8 μm, 1.3 μm and 1.55 μm to cause an increase in the insertion loss.

A remedial measure for the above mentioned problem is proposed in Preprint for the 11th Conference of Japan Association of Applied Magnetics, November, 1987, 2C-10, page 137, according to which trace amounts of divalent or tetravalent metallic ions, e.g., $Ca^{2+}$, $Mg^{2+}$ and $Ti^{4+}$, are added to the oxide garnet single crystal of this type. This method, however, does not provide a complete solution of the problem because the addition of the above mentioned metallic ions to the melt for the epitaxy necessarily causes changes in the composition of the epitaxially grown layer in the course of the growth so that the uniformity in the performance of the epitaxial garnet layer throughout the thickness can hardly be ensured since the epitaxial layer is usually required to have a thickness as large as 50 μm or larger.

SUMMARY OF THE INVENTION

The present invention accordingly has an object to provide an oxide garnet single crystal free from the above described problems and disadvantages in the prior art.

Thus, the present invention provides an oxide garnet single crystal having a chemical composition expressed by the formula $$(Bi_aEu_bLn_{1-a-b})_3(Fe_{1-c}M_c)_5O_{12}, \qquad (I)$$

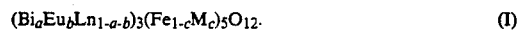

in which Ln is a rare earth element other than europium or, preferably, terbium, M is an element selected from the group consisting of aluminum, gallium, indium and scandium or, preferably, gallium, the subscript a is a positive number defined by $0.15 \leq a \leq 0.6$, the subscript b is a positive number defined by $0.01 \leq b\ 0.2$ and the subscript c is a positive number defined by $0.01 \leq c \leq 0.1$.

The above defined oxide garnet single crystal is preferably formed as an epitaxial layer on a substrate wafer of neodymium gallium garnet or gadolinium gallium garnet partially substituted with calcium, magnesium and/or zirconium having a specified lattice constant by the liquid-phase epitaxial method.

Detailed Description of the Preferred Embodiments

Figure 1:
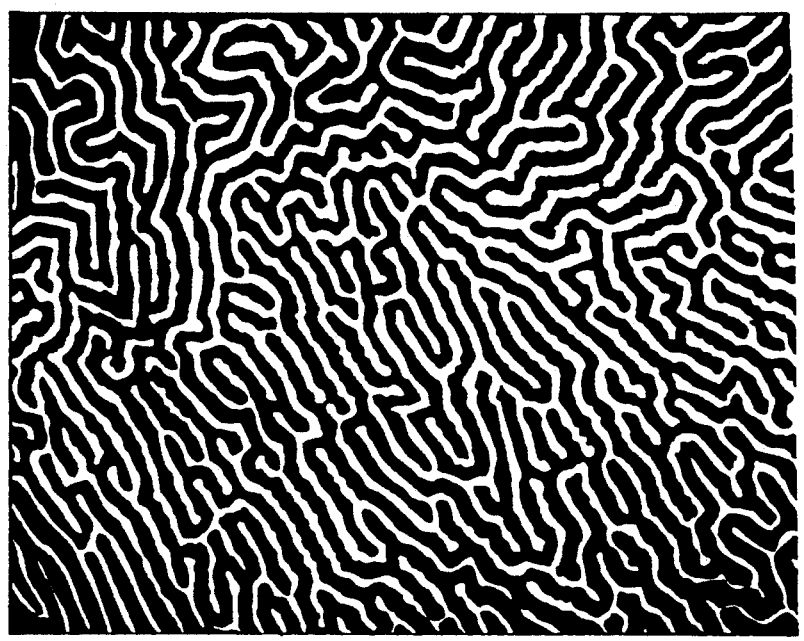
FIG. 1 is a photograph showing the maze-like magnetic domain structure in the oxide garnet single crystal prepared in Example 1 of the invention taken with a polarizing microscope.

As is described above, the oxide garnet single crystal of the invention is characterized by the unique chemical composition expressed by the above given formula (1). The oxide garnet is a kind of bismuth rare-earth iron garnet of which europium is an essential element as the rare earths. This unique chemical composition has been discovered as a result of the extensive investigations undertaken by the inventors for a rare earth element which can be in the divalent or tetravalent state in the bismuth rare-earth iron garnet. According to the discovery, europium has an effect to greatly improve the optical properties of the garnet crystal relative to the absorption of light. Being a rare earth element, furthermore, europium of course has no problem in the compatibility with the other rare earth elements so that the problem of non-uniform distribution of the element is rarely caused throughout the epitaxial layer however thick it may be as produced by the liquid-phase epitaxial method.

The oxide garnet single crystal of the invention is characterized by the chemical composition expressed by the formula $$(Bi_aEu_bLn_{1-a-b})_3(Fe_{1-c}M_c)_5O_{12}. \qquad (I)$$

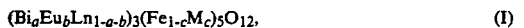

In the formula, Ln is a rare earth element other than europium or, namely, an element selected from the elements having atomic numbers of 39, 57 through 62 and 64 through 71. The element of the atomic number 61, i.e. prometheum, may be excluded in view of non-occurrence thereof in nature. It is optional that two kinds or more of these rare earth elements are used as the Ln in combination according to need. M is an element selected from the group consisting of aluminum, gallium, indium and scandium. The addition of the element M to the composition is preferable in respect of the decrease in the saturation magnetization so that the magneto-optical device can be more compact. The subscripts a and b are each a positive number in the ranges of 0.15 to 0.6 and 0.01 to 0.2, respectively, and the subscript c is a positive number in the range from 0.01 to 0.1 or, preferably, in the range from 0.05 to 0.1.

The oxide garnet single crystal of the invention can be obtained usually in the form of an epitaxial layer grown on the surface of a substrate which is preferably a single crystal of a rare earth gallium garnet. The epitaxial layer is formed by the well-known liquid-phase epitaxial method from a melt of a mixture of the oxides of the elements forming the resulting oxide garnet and a flux ingredients kept at a temperature somewhat lower than the melting point of the mixture.

The rare earth-gallium garnet used in the form of a single crystal wafer as the substrate on which the specified oxide garnet single crystal is grown by the liquid-phase epitaxial method is preferably samarium gallium garnet, referred to as SGG hereinbelow, neodymium gallium garnet, referred to as NGG hereinbelow, or gadolinium gallium garnet, referred to as GGG hereinbelow, partially substituted with one or more of the elements of calcium, magnesium and/or zirconium. Such a substituted GGG is available as a commercial product of the tradename of SOG or NOG (products by Shin-Etsu Chemical Co.). The rare earth-gallium garnet single crystals can be prepared by the Czochralski method from a melt of a mixture of the respective oxides. The epitaxial growth of the oxide garnet single crystal by the liquid-phase epitaxial method is performed by heating and melting a mixture of bismuth oxide $Bi_2O_3$, europium oxide $EU_2O_3$, oxide of the rare earth element Ln, iron oxide $Fe_2O_3$ and oxide of the element M with admixture of the flux ingredients such as lead oxide PbO and boron oxide $B_2O_3$ at a temperature of 1100° to 1200° C. and keeping the melt in a supercooled condition at a temperature of 750° to 950° C. so that the epitaxial layer of the oxide garnet single crystal is grown on the surface of the substrate wafer kept in the melt.

It is important that the inventive oxide garnet single crystal grown in the form of an epitaxial layer having a substantial thickness on the surface of a substrate wafer is free from cracks or unduly high stress. In this regard, it is important that a good matching within $\pm 0.0005$ nm or, preferably, $\pm 0.0003$ nm is obtained between the lattice constants of the rare earth-gallium garnet as the substrate and the oxide garnet single crystal grown thereon in the form of an epitaxial layer. This matching in the lattice constants can be obtained by adequately selecting the values of the subscripts a, b and c in the formula (1) depending on the kinds of the elements. For example, the lattice constant of the epitaxially grown layer of the inventive oxide garnet single crystal can be $1.2508 \pm 0.0005$ nm and $1.2496 \pm 0.0005$ nm when the substrate is NGG or NOG, respectively. When the chemical composition is adequately selected, the discrepancy between the lattice constants of the substrate and the epitaxial layer can be minimized so that the epitaxial layer of the inventive oxide garnet single crystal can be free from the defects of cracks, pits and the like regardless of the thickness thereof.

Furthermore, the europium oxide as an essential ingredient has good compatibility with the other ingredients so that the epitaxial layer is highly uniform in the composition throughout its thickness however thick the epitaxial layer may be. The europium ingredient serves to reduce the absorption of light in the working wavelengths so that the epitaxial wafer according to the invention can be an excellent material of various kinds of magneto-optical devices such as optical isolators.

In the following, the oxide garnet single crystal of the invention and the epitaxial wafer are described in more detail by way of examples.

EXAMPLE 1

The substrate for the epitaxial growth was a wafer of NOG having a diameter of 3 inches and a thickness of 500 $\mu$m, of which the lattice constant was 1.2496 nm. A melt of an oxide mixture was prepared from 977.38 g of bismuth oxide $Bi_2O_3$, 1.489 g of europium oxide $EU_2O_3$, 13.929 g of terbium oxide $Tb_4O_7$, 123.86 g of iron oxide $Fe_2O_3$, 5.273 g of gallium oxide $Ga_2O_3$, 936.36 g of lead oxide PbO and 41.77 g of boron oxide $B_2O_3$ by heating at 1100° C. in a platinum crucible containing the substrate wafer. The temperature of the melt was gradually decreased and the melt was kept at a temperature of 749.5° to 752.5° C. for 36 hours. The substrate wafer taken out of the melt after solidification was found to be covered with an epitaxially grown layer of an oxide garnet single crystal having a thickness of 0.492 mm.

The thus formed epitaxial layer was analyzed by the ICP (inductively coupled plasma) emission spectrophotometric analysis to give a result that the composition thereof could be expressed by the formula $(Bi_{0.26}Eu_{0.07}Tb_{0.67})_3(Fe_{0.94}Ga_{0.06})_5O_{12}$. This oxide garnet single crystal after removal of the substrate was polished on the surfaces and then cut into a piece of 2.9 mm by 2.9 mm square having a thickness of 0.381 mm, which was examined on a polarizing microscope to find a pattern of magnetic domains as illustrated in FIG. 1. This photograph clearly indicates that the oxide garnet single crystal has a very uniform structure.

Figure 2:
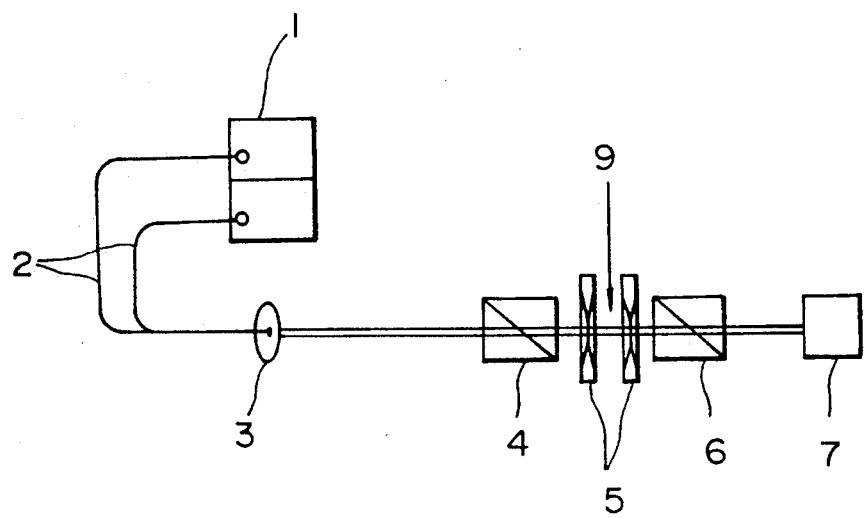
FIG. 2 is a schematic diagram illustrating the optical system for the measurement of the magneto-optical characteristics of the inventive oxide garnet single crystal.

The test piece was then provided with an AR (antireflection) coating and further examined for the magneto-optical characteristics at a wavelength of 1.3 $\mu$m using a measurement system schematically illustrated in FIG. 2 having an LD (laser diode) light source 1, optical fibers 2, collimator lens 3, polarizer 4, a pair of electromagnets 5, between which the test piece 9 was inserted, analyzer 6 and photodetector 7, in which the diameter of the light beam was 1.0 to 1.5 mm and the intensity of the incident light from the LD light source 1 was 0.598 mW at the wavelengths of 1317 nm. The results of the magneto-optical measurement were: angle of Faraday rotation 44.7°; loss by light absorption 0.03 dB; and temperature dependency of the angle of Faraday rotation 0.04°/°C.

For comparison, the same magneto-optical measurement as above was conducted with a single crystal of another bismuth-rare earth-iron oxide garnet having a chemical composition expressed by the formula $(Bi_{1.15}Gd_{0.55}Lu_{1.30})Fe_5O_{12}$. The result was that the loss by light absorption was as large as 0.8 dB.

EXAMPLE 2.

The substrate for the epitaxial growth was a wafer of NOG having a diameter of 3 inches and a thickness of 500 pm, of which the lattice constant was 1.2496 nm. A melt of an oxide mixture was prepared from 232.12 g of bismuth oxide $Bi_2O_3$, 0.328 g of europium oxide $Eu_2O_3$, 2.051 g of yttrium oxide $Y_2O_3$, 29.49 g of iron oxide $Fe_2O_3$, 1.255 g of gallium oxide $Ga_2O_3$, 223.33 g of lead oxide PbO and 9.952 g of boron oxide $B_2O_3$ by heating at 1100° C. in a platinum crucible containing the substrate wafer. The temperature of the melt was gradually decreased and the melt was kept at a temperature of 745.0° to 748° C. for 17 hours. The substrate wafer taken out of the melt after solidification was found to be covered with an epitaxially grown layer of an oxide garnet single crystal having a thickness of 0.350 mm.

The thus formed epitaxial layer was analyzed by the ICP (inductively coupled plasma) emission spectrophotometric analysis to give a result that the composition thereof could be expressed by the formula $(Bi_{0.40}Eu_{0.07}Y_{0.53})_3(Fe_{0.94}Ga_{0.06})_5O_{12}$. This oxide garnet single crystal after removal of the substrate was polished on the surfaces and then cut into a piece of 2.9 mm by 2.9 mm square having a thickness of 0.205 mm, which was examined for the magneto-optical characteristics in the same manner as in Example 1. The results of the magneto-optical measurement were: angle of Faraday rotation 45.2°; loss by light absorption 0.12 dB; and temperature dependency of the angle of Faraday rotation 0.11°/°C.

What is claimed is:

1. A rare earth garnet based epitaxial wafer which comprises:
   (a) a substrate wafer which is formed of a single crystal of a rare earth-gallium garnet; and
   (b) a layer of a single crystal of an oxide garnet having a chemical composition expressed by the formula $$(Bi_a Eu_b Ln_{1-a-b})_3 (Fe_{1-c} M_c)_5 O_{12},$$

in which Ln is a rare earth element other than europium, M is an element selected from the group consisting of aluminum, gallium, indium and scandium, the subscript a is a positive number defined by $0.15 \leq a \leq 0.6$, the subscript b is a positive number defined by $0.01 \leq b \leq 0.16$ and the subscript c is a positive number defined by $0.01 \leq c \leq 0.1$ epitaxially grown on the surface of the substrate wafer.

2. The rare earth garnet based epitaxial wafer as claimed in claim 1 wherein the rare earth-gallium garnet is neodymium-gallium garnet.

3. The rare earth garnet based epitaxial wafer as claimed in claim 1 wherein the rare earth-gallium garnet is gadolinium-gallium garnet partially substituted with at least one element selected from the group consisting of calcium, magnesium and zirconium.

4. The rare earth garnet based epitaxial wafer as claimed in claim 1 wherein the subscript c is in the range from 0.05 to 0.1.

5. The rare earth garnet based epitaxial wafer as claimed in claim 1 wherein the element denoted by M is gallium.

* * * * *